(12) United States Patent
Economikos et al.

(10) Patent No.: US 6,485,355 B1
(45) Date of Patent: *Nov. 26, 2002

(54) METHOD TO INCREASE REMOVAL RATE OF OXIDE USING FIXED-ABRASIVE

(75) Inventors: Laertis Economikos, Wappingers Falls, NY (US); Alexander Simpson, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/887,790

(22) Filed: Jun. 22, 2001

(51) Int. Cl.⁷ .................................. B24B 1/00
(52) U.S. Cl. ............................ 451/41; 451/60; 438/692
(58) Field of Search .................... 451/41, 59, 60; 438/692, 693

(56) References Cited

U.S. PATENT DOCUMENTS

| | | |
|---|---|---|
| 5,300,463 A | 4/1994 | Cathey et al. |
| 5,352,277 A | 10/1994 | Sasaki |
| 5,607,718 A | 3/1997 | Sasaki et al. |
| 5,725,417 A | 3/1998 | Robinson |
| 5,733,176 A | 3/1998 | Robinson et al. |
| 5,782,675 A | 7/1998 | Southwick |
| 5,855,804 A | 1/1999 | Walker et al. |
| 5,876,490 A | 3/1999 | Ronay |
| 5,897,424 A | 4/1999 | Evans et al. |
| 5,897,426 A | 4/1999 | Somekh |
| 5,914,275 A | 6/1999 | Kodera et al. |
| 5,919,082 A | 7/1999 | Walker et al. |
| 5,958,794 A | 9/1999 | Bruxvoort et al. |
| 5,968,280 A | 10/1999 | Ronay |
| 5,972,124 A | 10/1999 | Sethuraman et al. |
| 5,972,792 A | 10/1999 | Hudson |
| 5,981,454 A | 11/1999 | Small |
| 6,019,806 A | 2/2000 | Sees et al. |
| 6,062,952 A | 5/2000 | Robinson et al. |
| 6,069,081 A | 5/2000 | Kelleher et al. |
| 6,132,637 A | 10/2000 | Hosali et al. |
| 6,143,662 A | 11/2000 | Rhoades et al. |
| 6,171,180 B1 | 1/2001 | Koutny, Jr. et al. |
| 6,171,352 B1 | 1/2001 | Lee et al. |
| 6,238,592 B1 * | 5/2001 | Hardy et al. ............... 252/79.1 |
| 6,294,470 B1 * | 9/2001 | Economikos et al. ....... 438/692 |

* cited by examiner

Primary Examiner—George Nguyen
Assistant Examiner—Dung Van Nguyen
(74) Attorney, Agent, or Firm—Steven Capella

(57) ABSTRACT

The invention provides fixed-abrasive chemical-mechanical polishing processes which are effective in rapidly reducing thickness of oxide layers, especially siliceous oxides. The processes of the invention are preferably characterized by at least one step involving simultaneous use of a fixed-abrasive polishing element and an aqueous liquid medium containing an abrasive. Where the original oxide layer has topographic variation, the thickness reduction technique of the invention may be preceeded by topography reduction step using a fixed-abrasive and an aqueous medium containing a polyelectrolyte for at least a portion of the polishing process involving reduction in the amount of topographic variation (height differential) across the oxide layer on the substrate.

33 Claims, 3 Drawing Sheets

METHOD TO INCREASE REMOVAL RATE OF OXIDE USING FIXED-ABRASIVE

BACKGROUND OF THE INVENTION

While a variety of materials configurations exist in integrate circuit structures, a common element for many integrated circuit structures is the dielectric-filled isolation trench. Isolation trenches are widely used to allow the compact arrangement of electrically active components making up the integrated circuit(s) without adverse effects on electrical operability.

When isolation trench structures are formed in a substrate (e.g., by etching), variation in trench depth often occurs between the various trenches formed on the same substrate level on different parts of the wafer. Typically, the variation may be on the order of about 10% of the intended trench depth. To ensure that all the trenches (across the entire wafer) are completely filled with dielectric isolation material, it is typically necessary to deposit sufficient dielectric material to account for the non-uniformity of trench depth.

The necessity to account for variation in trench depth results in an overfill of the shallower trenches and a fairly thick deposit over the wafer surface. Additionally, the dielectric material (typically an oxide) deposited to fill the trenches is typically conformal to some extent. Thus, the local step topography (step height) of the trenches is reflected at least to some extent in the upper surface of the dielectric deposited to fill the trenches. Large step height is normally encountered in combination with a high "within" wafer (overfill) thickness. The deeper (or higher aspect ratio) the trench to be filled, the greater the step height in the dielectric filling layer and the more overfill is required to ensure complete filling of the trench structures across the wafer.

Another use of dielectric oxides, such as silicon oxides formed by reacting tetraethylorthosilicate (TEOS) and oxygen or ozone, is for so-called interlevel dielectric (ILD), e.g., between metal interconnects of aluminum/copper or tungsten typically for back end of the line (BEOL) wiring. A general discussion of interlevel dielectrics can be found in "Fundamentals of Semiconductor Processing Technology" by El-Kareh, Kluwer Academic Publishers, (1995), pages 565–571, which discussion is incorporated herein by reference. Silicon oxide layers and other insulators obtained by other processes may also be used as interlevel dielectrics. For example, other widely used materials for such purposes are boron and/or phosphorous doped silicate glasses.

Chemical-mechanical polishing (CMP) to remove dielectric materials has been widely used to improve the quality and manufacturability of integrated circuit device structures. Generally, the objective in polishing is to remove the deposited dielectric material across the wafer so it remains only within the trenches (or between conductive features, e.g., metal lines) and presents a planar surface for subsequent processing.

Often, a reactive ion etching process (to reduce step height and/or overall thickness in the deposited dielectric material) is required in combination with a conventional slurry chemical-mechanical polishing (CMP) process in order to obtain proper planarization. Reactive ion etch processes are not desirable from the point of cost and/or process control.

Conventional fixed-abrasive CMP (alkaline medium—pH=10.5–12—using a fixed-abrasive) is generally selective to step height (i.e., capable of reducing step height differential), but where the overfill is substantial, fixed-abrasive CMP is not capable of performing the necessary material removal which results in a non-planar final surface. This deficiency limits use of fixed-abrasive CMP processes to structures with small (e.g., less than 200 Å) variation in trench depth or oxide overfill.

Recent improvements to fixed abrasive CMP processes disclosed in U.S. patent applications Ser. No. 09/469,922, filed Dec. 22, 1999, now U.S. Pat No. 6,294,470 and 09/702,311, filed Oct. 31, 2000, have improved the ability to planarize structures with more substantial topography, however, once topography removal has been achieved, the reduction of the planarized layer thickness (e.g., to reach an underlying etch stop layer) can become a very slow process. This problem is especially apparent for highly overfilled structures.

It would be undesirable to perform the topography reduction and thickness reduction in separate tools. Thus, there is a need for improved fixed abrasive polishing processes which are capable of more rapidly reducing the thickness of subtantially planarized oxide layers to produce a substantially planar surface while avoiding the need for RIE etch back processing or other undesirable alternatives.

SUMMARY OF THE INVENTION

The invention provides fixed-abrasive chemical-mechanical polishing processes which are effective in reducing the thickness of oxide layers, especially siliceous oxides, and more especially substantially planar oxide layers. The invention also provides fixed-abrasive chemical-mechanical polishing processes which are capable of planarizing oxide materials with even where the starting oxide layer has significant topographical variation and significant overfill. The processes of the invention are preferably characterized by a step involving simultaneous use of a fixed-abrasive polishing element and an aqueous liquid medium containing an abrasive for at least a portion of the polishing process involving reduction in thickness of an oxide layer on the substrate.

In one aspect, the invention encompasses method of reducing thickness of an oxide layer on a substrate by fixed-abrasive chemical-mechanical polishing, the method comprising:
 a) providing a substrate having an oxide layer on a first surface,
 b) providing an aqueous liquid medium containing a first abrasive component,
 c) contacting the oxide layer of the substrate with the aqueous liquid medium and with a polishing member, the polishing member containing a fixed-abrasive component therein, and
 d) maintaining the contact of step c) while providing movement between the substrate and polishing member, whereby the oxide layer becomes reduced in thickness.

The oxide layer to be polished in step a) is preferably substantially planar. The oxide is preferably a dielectric material, more preferably silica or boron phosphosilicate glass (BPSG). Preferably, step d) is conducted until an underlayer is revealed to a desired extent.

In another aspect, the invention encompasses a method of polishing an oxide layer on a substrate by fixed-abrasive chemical-mechanical polishing, the method comprising:
 a) providing a substrate having an oxide layer on a first surface, the oxide layer having (i) an overfill thickness across substantially all of the layer, and (ii) portions above the overfill thickness which have a height differential relative to each other, the thickness and height being measured from a reference plane parallel with a principal plane of the substrate, b) providing a first aqueous liquid medium containing a polyelectrolyte, c) contacting the oxide layer with the first aqueous liquid medium and with a polishing member, the polishing member containing a fixed-abrasive component therein, d) maintaining the contact of step c) while providing movement between the substrate and polishing member, whereby the height differential becomes reduced, e) providing a second aqueous liquid medium containing a first abrasive component, f) contacting the oxide layer from step d) with the second aqueous liquid medium and with the polishing member, and g) maintaining the contact of step f) while providing movement between the substrate and polishing member, whereby the overfill thickness is reduced.

Preferably, the first aqueous medium is substantially abrasive-free. If desired, the height differential reduction steps could be replaced with an alternative method for reducing height differential.

These and other aspects of the invention are described in further detail below.

DETAILED DESCRIPTION OF THE INVENTION

Figure 1:
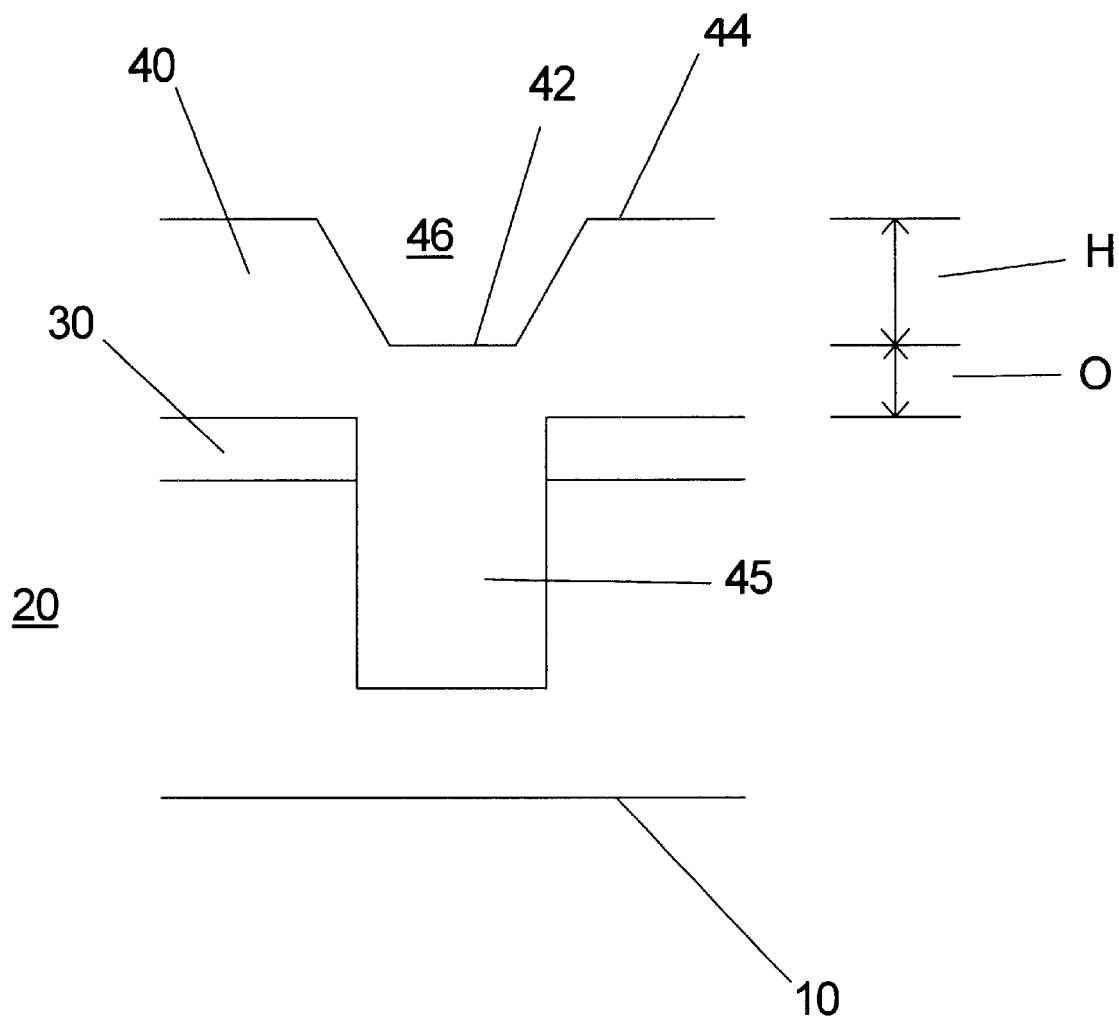
FIG. 1 shows a schematic cross section of a dielectric isolation layer to be planarized on a substrate, the layer having overfill and a height differential between portions.

The invention provides fixed-abrasive chemical-mechanical polishing processes which are effective in reducing the thickness of oxide layers, especially siliceous oxides, and more especially substantially planar oxide layers. The invention also provides fixed-abrasive chemical-mechanical polishing processes which are capable of planarizing oxide materials with even where the starting oxide layer has significant topographical variation and significant overfill. The processes of the invention are preferably characterized by a step involving simultaneous use of a fixed-abrasive polishing element and an aqueous liquid medium containing an abrasive for at least a portion of the polishing process involving reduction in thickness of an oxide layer on the substrate.

More specifically, the invention encompasses method of reducing thickness of an oxide layer on a substrate by fixed-abrasive chemical-mechanical polishing, the method comprising:

a) providing a substrate having an oxide layer on a first surface, b) providing an aqueous liquid medium containing a first abrasive component, c) contacting the oxide layer of the substrate with the aqueous liquid medium and with a polishing member, the polishing member containing a fixed-abrasive component therein, and d) maintaining the contact of step c) while providing movement between the substrate and polishing member, whereby the oxide layer becomes reduced in thickness.

The processes of the invention may be used to polish various oxide materials on various substrates, however the processes of the invention are especially useful in the context of oxide dielectric materials and substrates used in the production of integrated circuit devices and/or other microlithographically created articles. The materials to be polished are preferably oxide dielectric materials to be configured or removed in the production of such devices or articles. The processes of the invention are especially useful for the planarization or removal of siliceous oxide materials, more especially silicon dioxide materials. The processes of the invention may also be used with other siliceous materials such as doped silicon dioxide films (e.g., BPSG, BSG, etc.). For interlevel dielectric oxides, the oxide is preferably a silicon oxide (e.g., $SiO_2$) and/or a silicate containing one or more elements selected from groups 3A (e.g. boron) and 5A (e.g. phosphorus or arsenic). The interlevel dielectric may be adjacent to metal or metal-containing features formed from various materials such as copper, copper alloy, titanium, titanium nitride, tantalum, tantalum nitride, aluminum and/or aluminum alloy.

The oxide layer to be polished in step d) is preferably substantially free of significant topography (i.e., it is preferably substantially planar). Where significant topography exists above any overfill component, alternative techniques are preferably used prior to step a) above in order to remove such topography. See especially the discussion of further aspects of the invention below where the thickness reduction steps are preceded by topography removal step(s).

An example of a typical overfilled oxide structure is shown in FIG. 1. The substrate 20 has a first layer 30 (e.g., a silicon nitride stop layer) and a trench 45 (e.g., a trench to be filled with an oxide dielectric isolation material). The oxide layer 40 overfills trench 45 and oxide layer 40 has a depression 46 therein. The height differential H is the distance between top surface 44 and depression surface 42 measured relative to a reference plane 10. Layer 40 in FIG. 1 may have any height differential typically found in the manufacture of isolation features, e.g., about 2000 Å or more, especially about 4000 Å or more. A typical height differential of interest would be on the order of about 4000 to 7000 Å. As noted above, such topography is preferably removed before use of the thickness reduction technique of the invention.

The degree of overfill corresponds to height O which extends across the entire oxide layer 40. The thickness reduction processes of the invention are especially useful for reducing the overfill thickness of substantially planarized layers such as the appearance of layer 40 in FIG. 2. The methods of the invention may be used with any overfill thickness. A typical overfill thickness may be on the order of at least 500 Å, more typically at least 1000 Å, and especially on the order of 1000–2000 Å where deep trenches are being filled.

Oxide material 40 may be provided by various known techniques such as spin-on-glass (SOG) coating, chemical vapor deposition (CVD), physical vapor deposition, high density plasma or other technique. See for example, the various techniques discussed in "Fundamentals of Semiconductor Processing Technologies", by Badih El-Kareh, Kluwer Academic Publishing, 1995 or other texts. Typically, deposition or formation of the dielectric oxide layer 40 over a surface having topography results in topographic variation in the oxide layer 40. In some instances, topographic variation may occur in oxide layer 40 even where the structure underlayer 30 contains no topographic variation (not shown), for example, if the formation of oxide layer 40 is preferential over certain areas of layer 30 (e.g., due to variation of material composition in regions of layer 30 and/or due to the nature of the specific dielectric layer formation step itself). Topographic variation may also occur in oxide layer 40 where the structure underlayer 30 contains a topographic variation within a die and across the wafer. This variation may be attributed to variations in trench 45 depth and width. Layer 40 may contain one or more such regions having a height differential, e.g., where a plurality of trenches 45 are to be filled.

The abrasive-containing aqueous liquid medium preferably contains an abrasive suitable for removal of oxide materials as may be known in the art. The abrasive comprises ceria, more preferably the abrasive consists essentially of ceria. The concentration of ceria in the aqueous medium is preferably less than the amount typically used in conventional slurry-based CMP processes. Preferably, the abrasive-containing aqueous medium contains about 0.1–50 g of abrasive particles per liter, more preferably about 0.5–2 g/l. The abrasive-containing liquid medium preferably has a pH of about 5–13, more preferably a pH of about 7–12, most preferably about 9–11.5. The abrasive-containing liquid medium may also contain additives such as polyelectrolytes described below (e.g., polyacrylic acid) to facilitate stopping upon underlayer exposure.

The processes of the invention are otherwise not limited to use of any specific fixed-abrasive CMP set up or apparatus. Examples of fixed-abrasives and other apparatus are disclosed in U.S. Pat. Nos. 5,958,794; 5,855,804; 5,972,124; 5,897,426; 5,733,176; 5,919,082; 5,972,792; or 5,782,675, the disclosures of which are incorporated herein by reference. The fixed abrasive member preferably uses a ceria abrasive fixed therein.

The method step d) is preferably conducted until the oxide layer becomes reduced to a desired thickness and/or until a stop material (underlayer or metal feature) is exposed to a desired extent. For example, the structure of FIG. 3 may represent a desired endpoint for the process.

As note above, where the oxide layer 40 has substantial initial topography, the thickness reduction step is preferably preceeded by a topography reduction step. Thus, the invention further encompasses an overall method where such topography is substantially removed followed by the thickness reduction technique of the invention. A preferred version of such an overall method comprises:

a) providing a substrate having an oxide layer on a first surface, the oxide layer having (i) an overfill thickness across substantially all of the layer, and (ii) portions above the overfill thickness which have a height differential relative to each other, the thickness and height being measured from a reference plane parallel with a principal plane of the substrate, b) providing a first aqueous liquid medium containing a polyelectrolyte, c) contacting the oxide layer with the first aqueous liquid medium and with a polishing member, the polishing member containing a fixed-abrasive component therein, d) maintaining the contact of step c) while providing movement between the substrate and polishing member, whereby the height differential becomes reduced, e) providing a second aqueous liquid medium containing a first abrasive component, f) contacting the oxide layer from step d) with the second aqueous liquid medium and with the polishing member, and g) maintaining the contact of step f) while providing movement between the substrate and polishing member, whereby the overfill thickness is reduced.

The first aqueous liquid medium is characterized by the presence of a polyelectrolyte and is preferably substantially free of abrasive. The first aqueous liquid medium preferably contains at least about 0.01 wt. % of polyelectrolyte, more preferably about 0.05–1.0 wt. %, most preferably about 0.1–0.5 wt. %. The polyelectrolyte preferably comprises molecules having plural carboxylic acid, carboxylate ion moieties or other suitable ionic moieties. If desired, the polyelectrolyte may be formed from a precursor (e.g., a polyelectrolyte salt such as ammonium polyacrylate) capable of forming the desired ionic moieties in the aqueous liquid medium. The polyelectrolyte is more preferably selected from the group consisting of polyacrylic acid, polyethyleneimine, polymethylmethacrylate, polymethacrylic acid, polymaleic acid, hydrolyzed polyacrylamide or mixtures thereof. More preferably, the polyelectrolyte is polyacrylic acid. The polyelectrolyte preferably has a weight average molecular weight of about 500–20000, more preferably about 500–11000. Other polyelectrolytes, such as those described in U.S. Pat. No. 5,968,280, the disclosure of which is incorporated herein by reference, may also be used.

The first aqueous liquid medium preferably has a pH of about 1–13, more preferably about 2—12, most preferably about 4–5 (pH of 4.5 being especially preferred for high selectivity). A pH of about 1–3 is preferred where hydrolyzed polyacrylamide is used as the polyelectrolyte. Any suitable acid or base may be used for establishing the pH level of the solution. Where an alkaline pH is desired, hydroxides such as ammonium hydroxide are preferred for pH adjustment. For acidic pH, mineral acids are generally preferred for pH adjustment. The liquid medium may contain other components known in the art, however the liquid medium preferably consists essentially of water, base and polyelectrolyte.

The second aqueous liquid medium (containing abrasive) is preferably as described above relative to the thickness reduction method of the invention.

Figure 2:
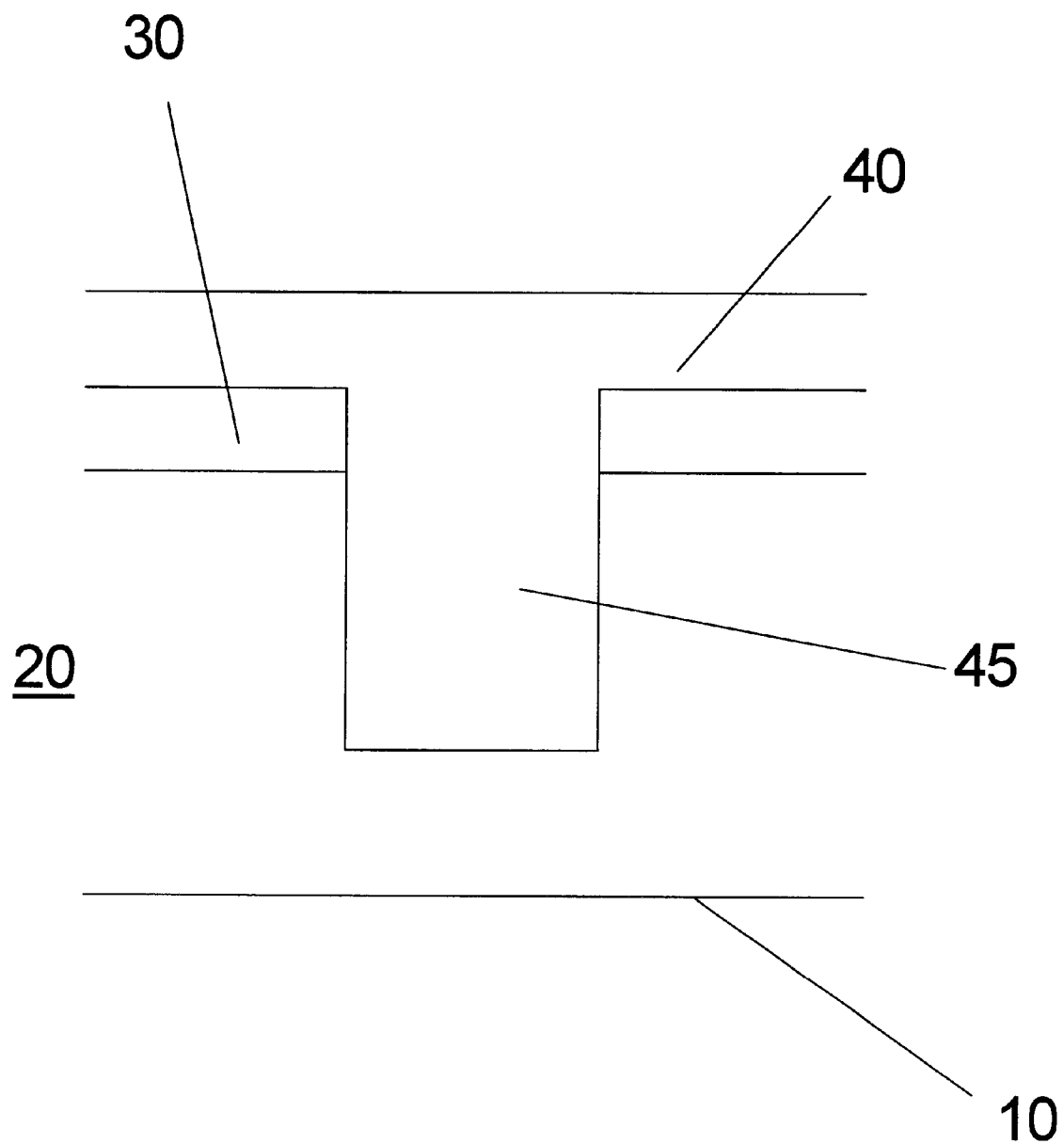
FIG. 2 shows a schematic cross section of a dielectric isolation layer of FIG. 1 after leveling off of the height differential.
Figure 3:
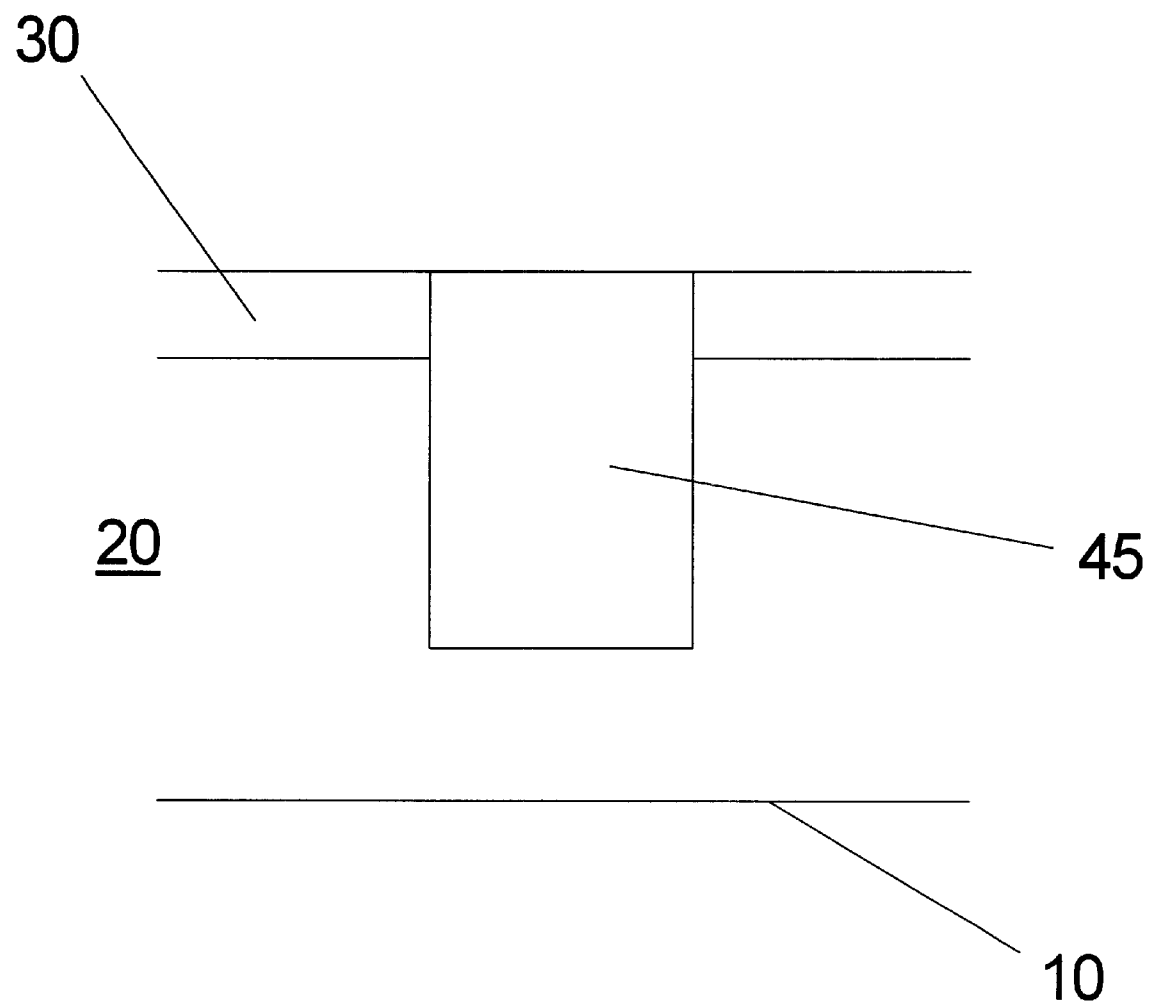
FIG. 3 shows a schematic cross section of a dielectric isolation layer of FIG. 2 after further reduction in height to reveal a stop layer.

Preferably, polishing step d) is carried out until a desired reduction in topography is achieved in oxide layer 40 (e.g., as shown in FIG. 2). Preferably, polishing step g) is conducted until an underlayer is revealed (e.g., as shown in FIG. 3).

The processes of the invention advantageously permit the rapid removal of blanket oxide layers (e.g., as may occur with overfill) at rates comparable to conventional slurry-based CMP processes with minimal or no occurrence of dishing compared to conventional slurry-based CMP processes.

What is claimed is:

1. A method of reducing thickness of an oxide layer on a substrate by fixed-abrasive chemical-mechanical polishing, said method comprising:

a) providing a substrate having an oxide layer on a first surface, b) providing an aqueous liquid medium containing a first abrasive component, c) contacting said oxide layer of the substrate with said aqueous liquid medium and with a polishing member, the polishing member containing a fixed-abrasive component therein, and d) maintaining the contact of step c) while providing movement between said substrate and polishing member, whereby said oxide layer becomes reduced in thickness.

2. The method of claim 1 wherein said oxide layer provided in step a) is substantially planar.

3. The method of claim 1 wherein said first abrasive component is ceria.

4. The method of claim 1 wherein said aqueous medium contains about 0.1–50 g/l of said first abrasive component.

5. The method of claim 4 wherein said aqueous medium contains about 0.5–2 g/l of said first abrasive component.

6. The method of claim 1 wherein said aqueous medium has a pH of about 5–13.

7. The method of claim 1 wherein said thickness is reduced by at least 1000 Å in step d).

8. The method of claim 1 wherein step d) is conducted until at least a portion of an underlayer is exposed.

9. The method of claim 1 wherein said fixed-abrasive is ceria.

10. The method of claim 1 wherein said aqueous liquid medium further comprises a polyelectrolyte.

11. A method of polishing an over-filled oxide topographic feature on a substrate by fixed-abrasive chemical-mechanical polishing, said method comprising:

a) providing a substrate having an oxide layer on a first surface, said oxide layer having (i) an overfill thickness across substantially all of said layer, and (ii) portions above said overfill thickness which have a height differential relative to each other, said thickness and height being measured from a reference plane parallel with a principal plane of said substrate, b) providing a first aqueous liquid medium containing a polyelectrolyte, c) contacting said oxide layer with said first aqueous liquid medium and with a polishing member, the polishing member containing a fixed-abrasive component therein, d) maintaining the contact of step c) while providing movement between the substrate and polishing member, whereby said height differential becomes reduced, e) providing an second aqueous liquid medium containing a first abrasive component, f) contacting said oxide layer from step d) with said second aqueous liquid medium and with said polishing member, and g) maintaining the contact of step f) while providing movement between said substrate and polishing member, whereby said overfill thickness is reduced.

12. The method of claim 11 wherein said oxide layer resulting from step d) is substantially planar.

13. The method of claim 11 wherein said first abrasive component is ceria.

14. The method of claim 11 wherein said second aqueous medium contains about 0.1–50 g/l of said first abrasive component.

15. The method of claim 14 wherein said second aqueous medium contains about 0.5–2 g/l of said first abrasive component.

16. The method of claim 11 wherein said first aqueous medium provided in step b) substantially free of abrasive.

17. The method of claim 11 wherein said second aqueous medium has a pH of about 5–13.

18. The method of claim 11 wherein said thickness is reduced by at least 1000 Å in step g).

19. The method of claim 11 wherein step g) is conducted until at least a portion of an underlayer is exposed.

20. The method of claim 19 wherein said underlying layer comprises a nitride.

21. The method of claim 11 wherein said fixed abrasive is ceria.

22. The method of claim 11 wherein said oxide layer contains at least one topographically non-uniform feature having a height differential of at least about 2000 Å.

23. The method of claim 11 wherein said oxide is a siliceous oxide.

24. The method of claim 11 wherein said first aqueous medium contains at least about 0.01 wt. % of said polyelectrolyte.

25. The method of claim 24 wherein said first aqueous medium contains at least about 0.1 wt. % of said polyelectrolyte.

26. The method of claim 11 wherein said first aqueous medium has a pH of about 1–13.

27. The method of claim 26 wherein said first aqueous medium has a pH of about 4–5.

28. The method of claim 11 wherein said polyelectrolyte is selected from the group consisting of polyacrylic acid, polyethyleneimine, polymethylmethacrylate, polymethacrylic acid, polymaleic acid, or mixtures thereof.

29. The method of claim 11 wherein step (b) comprises combining an aqueous liquid medium with a polyelectrolyte precursor compound.

30. The method of claim 11 wherein said polyelectrolyte comprises moieties selected from the group consisting of carboxylic acid moieties, carboxylate moieties and mixtures thereof.

31. The method of claim 30 wherein said precursor compound is a polyelectrolyte salt.

32. The method of claim 11 wherein said polyelectrolyte is a hydrolyzed polyacrylamide.

33. The method of claim 11 wherein said second aqueous liquid medium further comprises a polyelectrolyte.

* * * * *